United States Patent
Horiguchi

(10) Patent No.: US 10,175,283 B2
(45) Date of Patent: Jan. 8, 2019

(54) DETERMINING DEVICE FOR DETERMINING ELECTRICAL LEAKAGE AT SPECIFIED PERIOD

(71) Applicant: DENSO CORPORATION, Kariya, Aichi-pref. (JP)

(72) Inventor: Masakatsu Horiguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/670,099

(22) Filed: Aug. 7, 2017

(65) Prior Publication Data

US 2018/0038904 A1    Feb. 8, 2018

(30) Foreign Application Priority Data

Aug. 5, 2016   (JP) ................... 2016-154484

(51) Int. Cl.
*G01R 31/02*    (2006.01)
*G01R 31/00*    (2006.01)
*G01R 31/12*    (2006.01)

(52) U.S. Cl.
CPC ......... *G01R 31/025* (2013.01); *G01R 31/006* (2013.01); *G01R 31/1272* (2013.01)

(58) Field of Classification Search
CPC . G01R 31/025; G01R 31/1272; G01R 31/006
USPC .................................... 324/433, 551
See application file for complete search history.

(56) References Cited

U.S. PATENT DOCUMENTS

2016/0297310 A1* 10/2016 Kojima ............... B60L 11/1816

FOREIGN PATENT DOCUMENTS

JP         2014-155329 A      8/2014

* cited by examiner

*Primary Examiner* — Farhana Hoque
(74) *Attorney, Agent, or Firm* — Oliff PLC

(57) ABSTRACT

A determining device determining electrical leakage in a specified circuit having a voltage source, includes: an AC-signal-output unit that outputs an AC signal to a signal line connected to the specified circuit; a detecting unit that detects a peak value of the AC signal; and a determining unit determining electrical leakage of the specified circuit based on the peak value. The specified circuit includes switching elements switching the connection between the voltage source and a specified voltage to be conduction or blocking; and a determining device prohibits overlapping of the point of time when the switching elements are switched from conduction to blocking or the point of time when switched from the blocking state to the conducting state, and the period from the point of time when the AC-signal-output unit starts outputting the AC signal until the detecting unit detects the peak value of the AC signal.

5 Claims, 8 Drawing Sheets

FIG.8
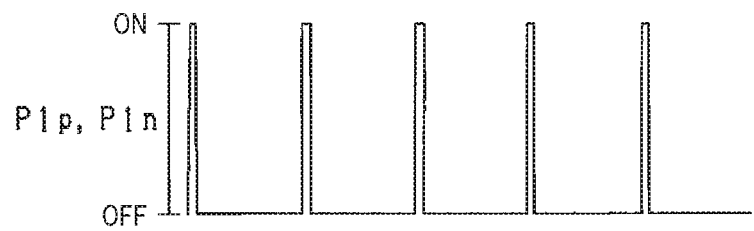
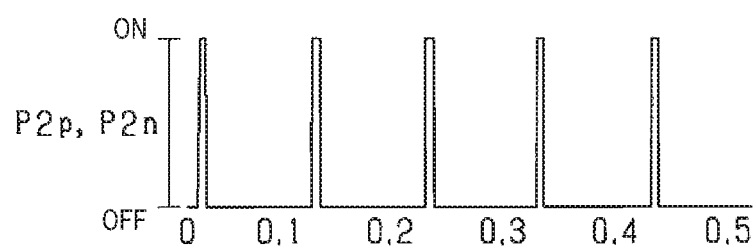
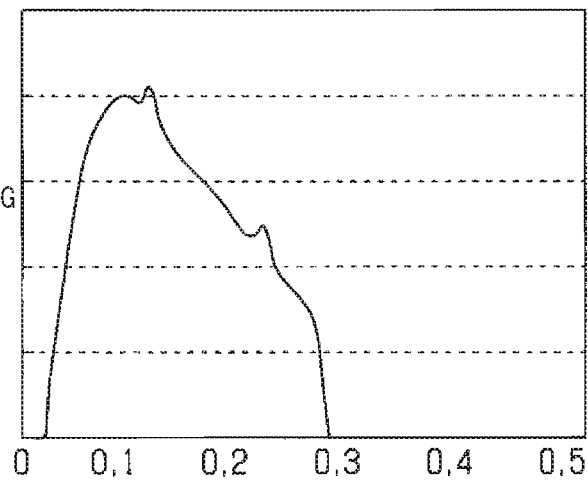

FIG.10
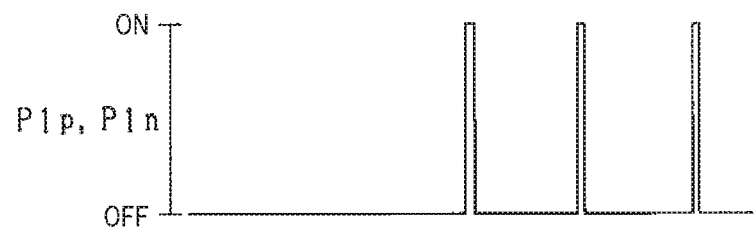
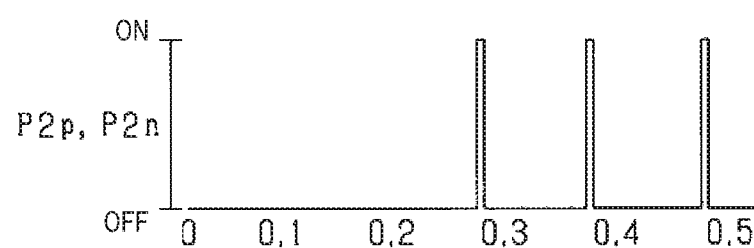
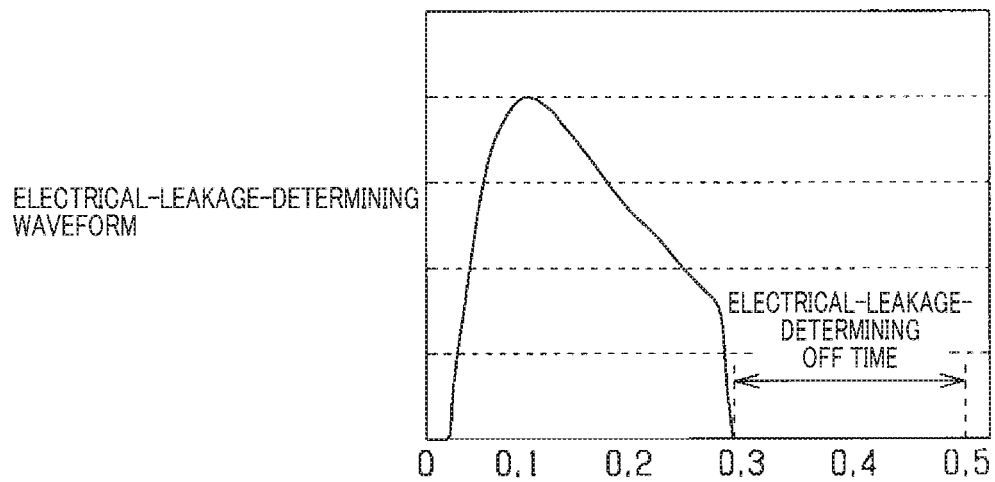

DETERMINING DEVICE FOR DETERMINING ELECTRICAL LEAKAGE AT SPECIFIED PERIOD

CROSS-REFERENCE TO RELATED APPLICATION

This application is based on and claims the benefit of priority from earlier Japanese Patent Application No. 2016-154484 filed Aug. 5, 2016, the description of which is incorporated herein by reference.

BACKGROUND OF THE INVENTION

Technical Field

The present invention relates to a determining device that determines whether there is electrical leakage in a specified circuit having a voltage source.

Description of the Related Art

An insulation-determining device (electrical leakage-determining device) that is mounted in a vehicle and detects a decrease in insulation resistance of an electrical system is known. For example, Japanese Patent Application No. 2014-155329 discloses a configuration for outputting an AC (alternating current) signal having a predetermined frequency to a signal line that is connected to an electrical system, and determining electrical leakage based on the peak value of the AC signal on that signal line.

Here, when there is a temporary change in the connected state between the voltage source and a specified voltage (for example, ground voltage), there is a concern that the common voltage of the signal line connected to the electrical system will fluctuate, and that errors in determining the electrical leakage will occur.

SUMMARY

The present disclosure has been achieved in light of the above-described circumstances and provides a device that suppresses incorrect determination of electrical leakage when the connected state between the voltage source and a specified voltage temporarily changes.

A first configuration is a determining device that determines electrical leakage in a specified circuit having a voltage source, and includes an AC-signal-output unit that outputs an AC signal having a specified frequency to a signal line that is connected to the specified circuit; a detecting unit that detects a peak value of the alternating-circuit signal on the signal line; and a determining unit that performs electrical leakage determination of the specified circuit based on the peak value; wherein the specified circuit includes first and second switching elements (Pip, Pin, 14, 15,) that switch the connection between the voltage source and a specified voltage to a conducting state or a blocked state; and the determining device prohibits overlapping of the point of time when the switching elements are switched from the conducting state to the blocked state, and the point of time when switched from the blocked state to the conducting state, and the period from the point of time when the AC-signal-output unit starts outputting the AC signal until the detecting unit detects the peak value of the AC signal.

When the state of the switching elements that conduct or block the connection between the voltage source and the specified voltage changes, the voltage of the signal line changes, and the precision of determining the electrical leakage based on the peak value of the AC on the signal line decreases. Therefore, by setting the point of time when the state of the switching elements that conduct or block the connection between the voltage source and the specified voltage changes so as not to be included in a period from the point of time when the AC-signal-output unit starts outputting the AC signal until the detecting unit detects the peak value of the AC signal, it is possible to suppress incorrect determination of electrical leakage.

In a second configuration, the specified circuit in the first configuration is connected to a differential-amplifier circuit to which both terminals of a battery as the voltage source are connected; the differential-amplifier circuit is connected with the specified circuit via a specified resistance; and the first switching elements (Pip, Pin) are provided between at least one terminal of both terminals of the battery and the differential-amplifier circuit.

The flying capacitor method is often used as configuration for detecting the terminal voltage of a battery as a voltage source; however, the flying capacitor method has a problem in that the circuit configuration becomes complicated. Therefore, instead of the flying capacitor method, configuration is possible in which a differential-amplifier circuit is connected to both terminals of a battery, and the terminal voltage of the battery is detected based on the output voltage from that differential-amplifier circuit. The differential-amplifier circuit divides the difference between the voltage of the first terminal (positive electrode or negative electrode) of a battery and a specified voltage by a dividing resistance, and has an op amp to which that divided voltage is inputted. Moreover, typically, switching elements are provided between the first terminal of the battery and the differential amplifier circuit for the purpose of saving power. When the state of the switching elements changes, the connected state between the battery and the specified voltage changes.

In other words, when the state of the first switching elements that are provided between at least one of both terminals of the battery and the differential-amplifier circuit changes, the voltage of the signal line changes, and precision of determination of electrical leakage based on the peak value of the AC signal on the signal line decreases. Therefore, by setting the point of time when the state of the first switching elements between the first terminal of the battery and the differential-amplifier circuit changes so as not to be included in a period from the point of time when the AC-signal-output unit starts outputting the AC signal until the detecting unit detects the peak value of the AC signal, it is possible to perform voltage detection and suppress incorrect determination of electrical leakage.

In a third configuration, the first switching elements that are provided between at least one terminal of both terminals of the battery and the differential-amplifier circuit in the second configuration are switched from a blocked state to a conducting state at every specified period; and in a period from the point of time when the AC-signal-output unit starts outputting the AC signal until the detecting unit detects the peak value of the AC signal, the determining device prohibits switching the first switching elements that are provided between at least one terminal of both terminals of the battery and the differential-amplifier circuit from a blocked state to a conducting state.

Furthermore, in configuration in which, by setting the first switching elements to the ON state at each specified period, the differential-amplifier circuit and battery are connected and detection of the voltage is performed, the configuration is such that switching the state of the first switching elements is prohibited during the period from the point of time when the AC signal starts to be outputted until the detecting unit detects the peak value of the AC signal, that is the period during which determination of electrical leakage is performed. With this configuration, it is possible to suppress incorrect determination of the electrical leakage, while at the same time obtain the terminal voltage of the battery at each specified period.

In a fourth configuration, the specified circuit of any one of the first to third configurations includes an electric load that, together with being connected to the voltage source, is connected to the specified voltage; and the second switching elements are provided between the voltage source and the electric load.

The electric load that is connected to the voltage source is typically connected to a specified voltage (for example, the ground voltage) at some location. Here, in configuration in which second switching elements are provided between the voltage source and the electric load, when the state of the second switching elements changes, the connected state between the voltage source and the specified voltage changes.

In other words, when the state of the second switching elements that are provided between the voltage source and the electrical load changes, the voltage on the signal line described above changes, and precision of determining electrical leakage based on the peak value of an AC signal on the signal line decreases. Therefore, by setting the point of time when the state of the second switching elements that are provided between the voltage source and the electric load changes so as not to be included in the period from the point of time when the AC-signal-output unit starts to output an AC signal until the detecting unit detects the peak value of the AC signal, it is possible to suppress incorrect determination of electrical leakage.

A fifth configuration prohibits overlapping of the point of time when the first and second switching elements are changed from a conducting state to a blocked state, and the point of time when changed from a blocked state to a conducting state, and the period from the point of time when the AC-signal-output unit starts outputting the AC signal until the AC-signal-output unit stops outputting the AC signal.

By setting the point of time when the state of the first and second switching elements that conduct or block the connection between the voltage source and the specified voltage changes so as not to be included in the period from the point of time when the AC-signal-output unit starts outputting the AC signal until the detecting unit detects the peak value of the AC signal, it is possible to more reliably suppress incorrect determination of electrical leakage.

BRIEF DESCRIPTION OF DRAWINGS

FIG. 8 is a diagram illustrating overlapping of an electrical leakage determining waveform and common voltage fluctuation.
FIG. 10 is a diagram illustrating the effect of an embodiment

DETAILED DESCRIPTION OF PREFERRED EMBODIMENTS

In the following, a first embodiment in which an "electrical leakage-determining device" is applied to a vehicle (for example, a hybrid vehicle, electric automobile, and the like) that includes a rotating electrical machine as the in-vehicle main unit will be explained with reference to the drawings.

Figure 1:
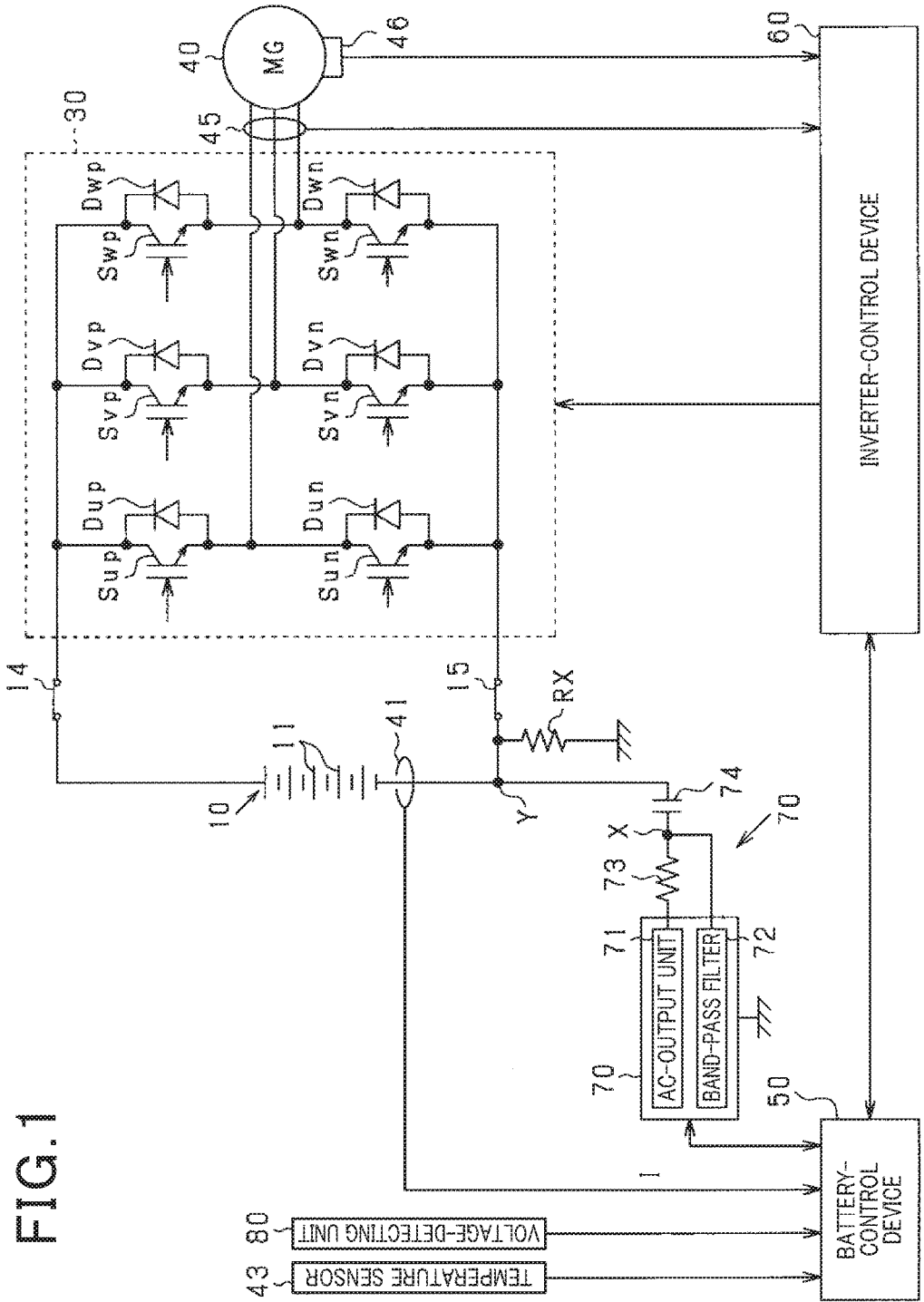
FIG. 1 is an electrical configuration diagram of an embodiment.

As illustrated in FIG. 1, the in-vehicle motor control system of this embodiment includes a battery pack 10, an inverter 30, a motor generator 40 and control devices 50, 60. The inverter 30 and motor generator 40 correspond to an "electric load".

The battery pack 10 is electrically connected to the motor generator 40 via the inverter 30. The battery pack 10 is a storage battery that has, for example, a terminal voltage of 100 V or more, and is configured with plural battery modules 11 that are connected in series. Moreover, a battery module 11 is configured with plural battery cells that are connected in series. As a battery cell it is possible to use, for example, a lithium-ion storage battery, or a nickel-hydrogen storage battery. The battery pack 10 and the battery module 11 correspond to a "battery" and a "voltage source", respectively. An electric double layer capacitor, DC to DC converter, and the like may also be used as a "voltage source".

The motor generator 40 is an in-vehicle main unit capable of transmitting power to the drive wheels which is not shown. In this embodiment, a 3-phase permanent magnet synchronous motor is used as the motor generator 40.

The inverter 30 has three sets of serially connected bodies of U, V, W-phase upper arm switches Sup, Svp, Swp, and U, V, W-phase lower arm switches Sun, Svn, Swn. Each of the serially connected bodies is connected in parallel with a smoothing capacitor 22. One end of the U, V, W-phase windings of the motor generator 40 is connected to the connecting points of each of the serially connected bodies. Incidentally, in this embodiment, voltage-controlled type semiconductor switching elements are used for the switches Sup to Swn, and more specifically IGBTs are used. Freewheel diodes Dup, Dun, Dvp Dvn, Dwp, Dwn are connected in reverse parallel with the switches Sup, Sun, Svp, Svn, Swp, Swn, respectively.

The battery-control device 50 obtains a detected value of the charge/discharge current I that is flowing in the battery pack 10 (in other words, battery modules 11) from a current sensor 41, obtains detected values of the terminal voltages of each of the battery modules 11 of the battery pack 10 from a voltage-detection unit 80, and obtains detected values of the temperatures of each of the battery modules 11 from a temperature sensor 43. Based on the obtained detected values, the battery-control device 50 calculates the charging rate for each of the battery modules 11. The battery-control device 50 is a control device that includes a CPU, ROM and RAM.

Moreover, when over discharging, over charging, or abnormal temperature rise occurs in any one of the battery modules 11, the battery-control device 50 stops charging and discharging of the battery pack 10 by switching relay switches 14, 15 that are provided between the battery pack 10 and inverter 30 to the OFF state.

The inverter-control device 60 obtains detected values of output electric power of each phase of the inverter 30 from a phase-current sensor 45, and obtains a detected value of the rotation angle of the motor generator 40 from a rotation-angle sensor 46 that is provided in the motor generator 40. Moreover, the inverter-control device 60 performs communication with the battery-control device 50, and obtains the detected value of the charge/discharge current I of the battery pack 10, and the calculated values of the charging rates of each of the battery modules 11 from the battery-control device 50.

The inverter-control device 60, based on the obtained detected values and calculated values, performs control for switching ON/OFF switches Scp, Scn of a boost converter 20, and control for switching ON/OFF switches Sup, Sun, Svp, Svn, Swp, Swn of the inverter 30. The inverter-control device 60 is a control device that includes a CPU, a ROM and a RAM. One control device may be configured to function both as a battery-control device 50, and as an inverter-control device 60.

The battery-control device 50 of this embodiment, by controlling an electrical leakage-detecting unit 70, detects electrical leakage in a high-voltage circuit that includes the battery pack 10, the inverter 30, and the motor generator 40. The electrical leakage-detecting unit 70 includes an AC (i.e., alternating current) signal-output unit 71 that outputs an AC signal having a specified frequency, and a band-pass filter 72. In this embodiment, the battery-control device 50 and the electrical leakage-detecting unit 70 form an "electrical leakage-determining device".

The AC signal-output unit 71 is connected to connection point Y (terminal on the low-voltage side of the battery pack 10) of the high-voltage circuit (specified circuit) via a resistor 73 and a capacitor 74 that are provided on the signal line. The capacitor 74 directly insolates the battery-control device 50 that is a low-voltage circuit, and the battery pack 10, inverter 30 and motor generator 40 that are a high-voltage circuit, in a direct-current isolation manner.

Each part of the high-voltage circuit is connected to the frame of the inverter 30 and motor generator 40 via insulation resistance. In FIG. 1, the insulation resistance in each part of the high-voltage circuit is collectively expressed as insulation resistance RX.

The band-pass filter 72 is connected to connection point X of the resistor 73 and capacitor 74. When the AC signal-output unit 71 outputs an AC signal to the signal line, the voltage at the connection point X is the value obtained by dividing the AC voltage that is outputted by the AC-signal-output unit 71 by the resistance value RA of the resistor 73 and the resistance value RX of the insulation resistance RX.

By obtaining the voltage at connection point X, the battery-control device 50, functioning as a "detecting unit" and a "determining unit", obtains the resistance value RX of the insulation resistance RX, and determines the insulated state of the high-voltage circuit. More specifically, by obtaining the voltage at the connection point X via the band-pass filter 72, the battery-control device 50 obtains the peak value of the voltage at connection point X. Then, based on the ratio of the peak value of the voltage at connection point X and the peak value of the AC signal that is outputted by the AC-signal-output unit 71, the battery-control device 50 obtains the resistance value RX of the insulation resistance RX, and determines whether or not the high-voltage circuit is insulated.

Figure 2:
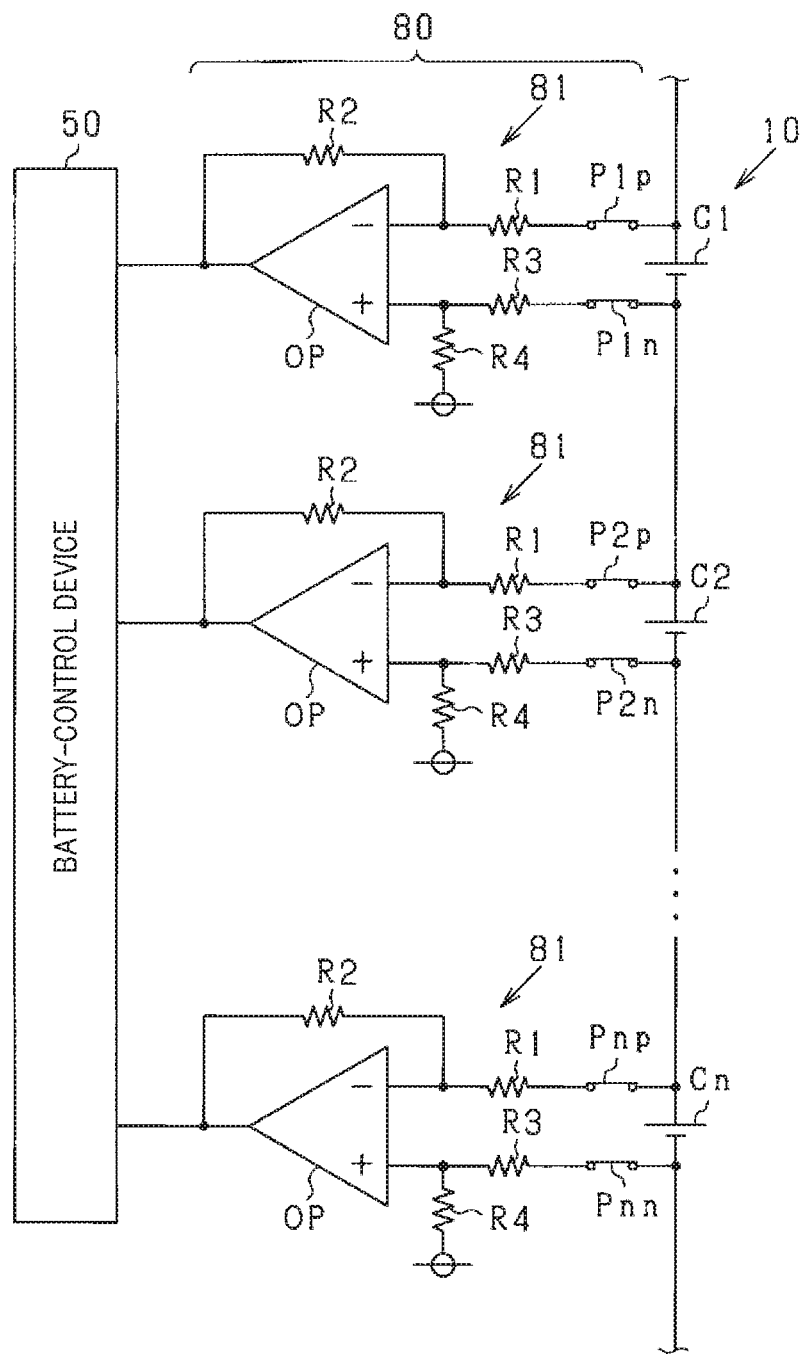
FIG. 2 is an electrical configuration diagram of a voltage-detecting unit.

In this embodiment, the voltage-detecting unit 80 performs voltage detection using the resistance voltage dividing method. In the following, the configuration and operation of the voltage-detecting unit 80 will be explained using FIG. 2.

The battery pack 10 is a serially connected body of n battery modules 11. Here, this is also expressed as battery modules C1 to Cn. A battery module Ci (i=1 to n) is located further toward the high-voltage side the smaller the index i is, so battery module C1 is located closest to the high-voltage side, and battery module Cn is located closest to the low-voltage side.

The voltage-detecting unit 80 has photo relays P1$p$ to Pn$p$, and P1$n$ to Pn$n$. Photo relay Pi$p$ is provided between the positive-electrode terminal of the battery module Ci and a differential-amplifier circuit 81, and photo relay Pi$n$ is provided between the negative-electrode terminal of the battery module Ci and the differential-amplifier circuit 81.

The differential-amplifier circuit 81 includes an op amp OP, and resistors R1 to R4. The positive-electrode terminal of the battery module Ci is connected to the inverting-input terminal (− terminal) of the op amp OP via the photo relay Pi$p$ and resistor R1. Furthermore, the output terminal of the op amp OP is connected to the inverting-input terminal of the op amp OP via the resistor R2. Moreover, the negative-electrode terminal of the battery module Ci is connected to the non-inverting-input terminal (+ terminal) of the op amp OP via the photo relay Pi$n$ and resistor R3. Furthermore, a specified reference voltage is connected to the non-inverting-input terminal of the op amp OP via the resistor R4.

When the resistance value of resistors R1, R3 is taken to be R1, and the resistance value of resistors R2, R4 is taken to be R2, and the output voltage Vout of the op amp OP (in other words, the differential-amplifier circuit 81) when the terminal voltage of the battery module Ci is taken to be Vi is:

$$Vout=-(R2/R1)Vi$$

The battery-control device 50 obtains the output voltage of the differential-amplifier circuit 81, and based on the obtained value, is able to obtain the terminal voltage Vi of each battery module Ci.

Here, when performing voltage detection using the voltage-detecting unit 80, and the photo relays Pi$p$, Pi$n$ are switched between the OFF state (blocked state) and ON state (conducting state), the connected state between the battery pack 10 and ground voltage changes. As a result, by the voltage at the connection point Y (voltage of the terminal on the low-voltage side of the battery pack 10, in other words, common voltage) changing, the voltage at connection point X changes, and as a result, there is a possibility that incorrect determination of whether or not the high-voltage circuit is insulated will occur.

Moreover, when switching between the ON state and the OFF state of the relay switches 14, 15 as well, the connected state between the battery pack 10 and the ground voltage changes. As a result, by changing the voltage at the connection point Y, the voltage at the connection point X changes, and as a result, there is a possibility that incorrect determination of whether or not the high-voltage circuit is insulated will occur.

The fluctuation in the common voltage of the high-voltage circuit caused by switching between the ON state and OFF state of the relay switches 14, 15 will be explained below using FIG. 3 and FIG. 4.

Figure 3:
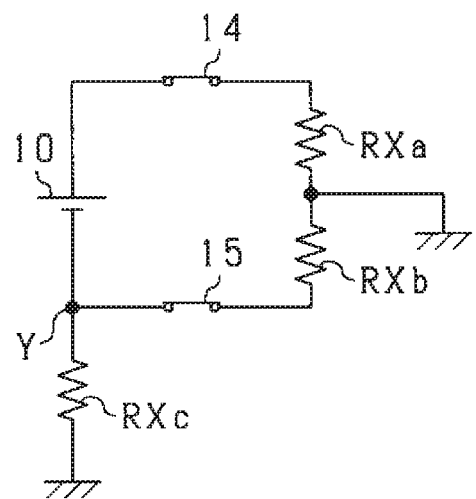
FIG. 3 is a diagram illustrating the connection between a battery pack and insulation resistance.

As illustrated in FIG. 3, the battery pack 10 is connected to the ground voltage (frame ground of the inverter 30 and the motor generator 40) via the insulation resistances RXa, RXb further on the inverter 30 side (electric load side) than the relay switches 14, 15. Moreover, the battery pack 10 is connected to the ground voltage via the insulation resistance RXc further on the battery pack 10 side than the relay switches 14, 15. The insulation resistances RXa to RXc express the insulating characteristic (difficulty of electrical leakage) that exists between the high-voltage circuit and the frame ground. For simplification, in the explanation below, the terminal voltage of the battery pack 10 is taken to be 200V, for example, and the resistance values of the insulation RXa to RXc are taken to be 10 MΩ, respectively.

As illustrated in FIG. 3, when both the relay switches 14, 15 are set to the ON state, the positive electrode of the battery pack 10 is connected to the ground voltage via the insulation resistance RXa, and the negative electrode of the battery pack 10 is connected to the ground voltage via the insulation resistance RXb. Therefore, the voltage at the positive electrode of the battery pack 10 becomes 100V with respect to the ground voltage, and the voltage at the negative electrode of the battery pack 10 becomes −100V with respect to the ground voltage.

Figure 4:
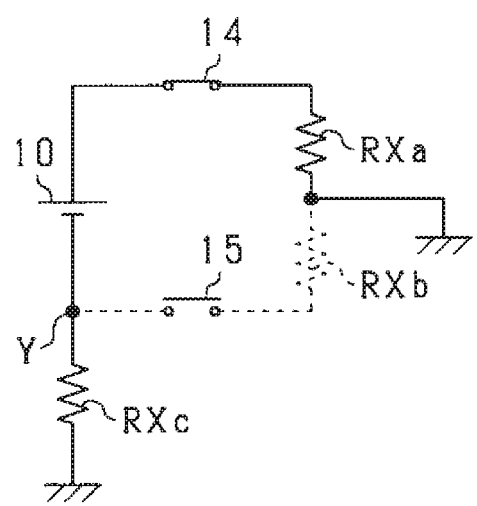
FIG. 4 is a diagram illustrating the connection between a battery pack and insulation resistance.

However, as illustrated in FIG. 4, when the relay switch 14 is set to the ON state and the relay switch 15 is set to the OFF state, the positive electrode of the battery pack 10 is connected to the ground voltage via the insulation resistance RXa, and the negative electrode of the battery pack 10 is connected to the ground voltage via the insulation resistance RXc. In this case, current does not flow in the insulation resistances RXa, RXc, and the voltage at the negative electrode of the battery pack 10 becomes 0V with respect to the ground voltage, and the voltage at the positive electrode of the battery pack 10 becomes 200V with respect to the ground voltage.

In other words, when the relay switches 14, 15 illustrated in FIG. 3 are both set to the ON state, and when the relay switch 14 illustrated in FIG. 4 is set to the ON state, and the relay switch 15 is set to the OFF state, the voltage at the connection point Y (negative electrode of the battery pack 10) fluctuates by 100V.

Next, the fluctuation of the common voltage of the high-voltage circuit that accompanies switching the photo relays Pip, Pin between the ON state and the OFF state will be explained using FIG. 5 to FIG. 7.

Figure 5:
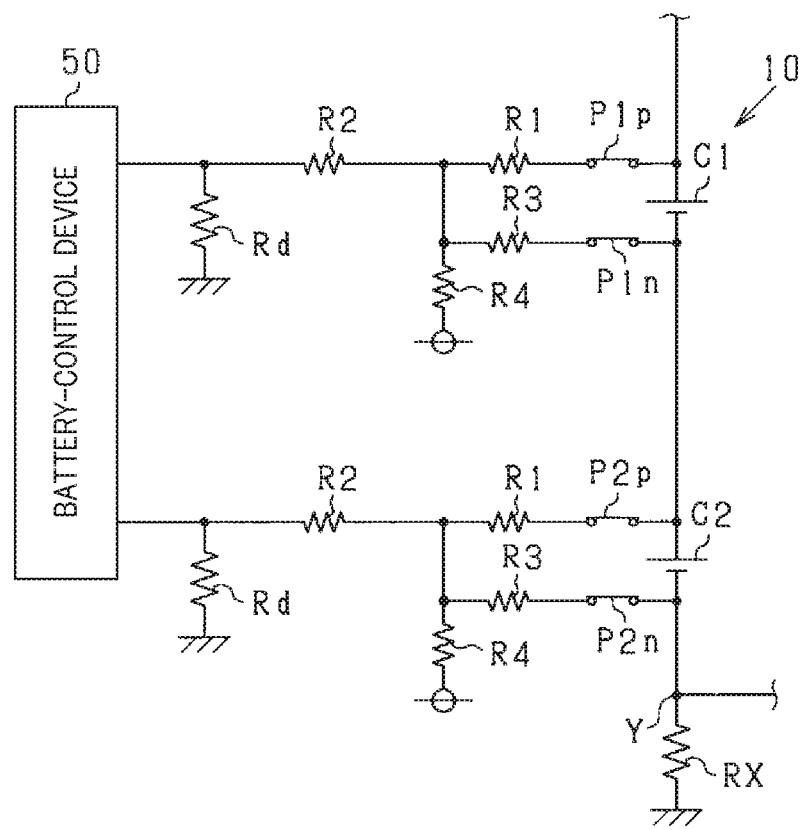
FIG. 5 is a diagram illustrating the connection between a battery pack and insulation resistance.

In the example illustrated in FIG. 5, in order to simplify the explanation, the number of battery modules 11 of the battery pack 10 is taken to be two (n=2). The positive electrode of the battery module C1 is connected to the inverting-input terminal of the op amp OP via the resistor R1 further on the op amp OP side than the photo relay P1$p$. The negative electrode of the battery module C1 is connected to the non-inverting-input terminal of the op amp OP via the resistor R3 further on the op amp OP side than the photo relay P1$n$. The positive electrode of the battery module C2 is connected to the inverting-input terminal of the op amp OP via the resistor R1 further on the op amp side than the photo relay P2$p$. The negative electrode of the battery module C2 is connected to the non-inverting-input terminal of the op amp OP via the resistor R3 further on the op amp OP side than the photo relay P2$n$.

In the differential-amplifier circuit 81, the non-inverting-input terminal and the inverting-input terminal are imaginarily shorted. Moreover, the output of the differential-amplifier circuit 81, in the low-voltage circuit, is connected to the ground voltage via the resistance Rd. Therefore, an equivalent circuit of the case in which the photo relays P1$p$, P1$n$, P2$p$ and P2$n$ are all set to the ON state can be represented as illustrated in FIG. 6.

Figure 6:
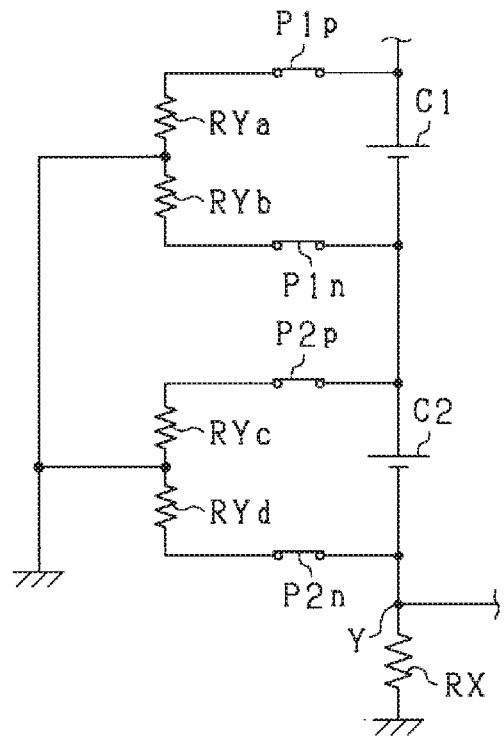
FIG. 6 is a diagram illustrating the connection between a battery pack and insulation resistance.

In the equivalent circuit represented in FIG. 6, the positive electrode (positive electrode of battery module C1) of the battery pack 10 is connected to the ground voltage via the combined resistance RYa that includes the resistor R1 and the like (resistance value is taken to be 10 MΩ for example), and the negative electrode (negative electrode of battery module C2) of the battery pack 10 is connected to the ground voltage via the combined resistance RYd that includes the resistor R3 and the like (resistance value is taken to be 10 MΩ for example). Therefore, the voltage at the positive electrode of the battery pack 10 becomes 100V with respect to the ground voltage, and the voltage of the negative electrode (negative electrode of battery module C2) of the battery pack 10 becomes −100V with respect to the ground voltage.

Figure 7:
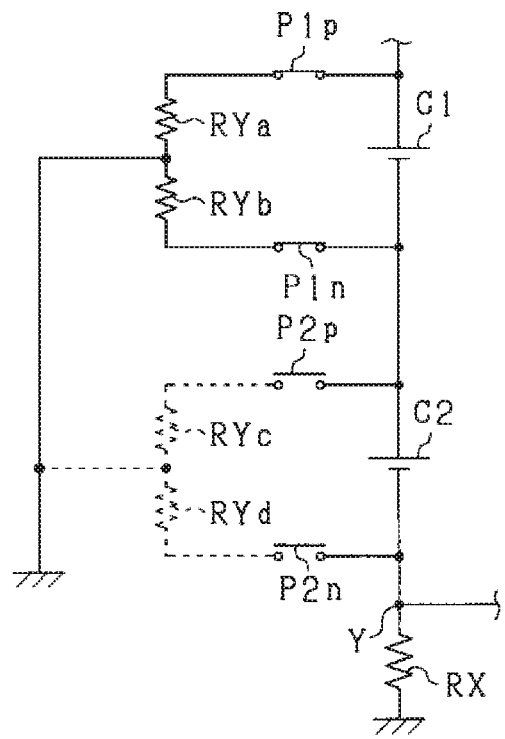
FIG. 7 is a diagram illustrating the connection between a battery pack and insulation resistance.

Moreover, the equivalent circuit when the photo relays P1$p$, P1$n$ are each set to the ON state and the photo relays P2$p$, P2$n$ are each set to the OFF state can be represented as illustrated in FIG. 7.

In the equivalent circuit represented in FIG. 7, the positive electrode of the battery module C1 is connected to the ground voltage via the combined resistance RYa, and the negative electrode of the battery module C1 is connected to the ground voltage via the combined resistance RYb that includes resistor R3 and the like. Therefore, the voltage at the positive electrode of battery module C1 (positive electrode of the battery pack 10) becomes 50V with respect to the ground voltage, and the voltage at the negative electrode of battery module C1 becomes −50V with respect to the ground voltage. Furthermore, the voltage of the negative electrode of battery module C2 (negative electrode of the battery pack 10) becomes −150V with respect to the ground voltage.

In other words, when the photo relays P1$p$, P1$n$, P2$p$, and P2$n$ illustrated in FIG. 6 are all set to the ON state, the photo relays P1$p$, P1$n$ illustrated in FIG. 7 are each set to the ON state, and the photo relays P2$p$, P2$n$ are each set to the OFF state, the voltage at the connection point Y (negative electrode of the battery pack 10) fluctuates 50V.

Depending on the state of the relay switches 14, 15 and the state of the photo relays Pip, Pin, the voltage at the negative electrode of the battery pack 10 (common voltage) fluctuates with respect to the ground voltage. As a result, the voltage at the connection point X changes and there is a possibility that whether or not the high-voltage circuit is insulated will be incorrectly determined.

FIG. 8 illustrates an example of the electrical leakage-determining waveform when the voltage-detection timing of the battery modules 11 (ON timing of photo relays Pip, Pin), and the application of the AC voltage in electrical leakage determination overlap. By performing switching of the OFF state and ON state of the photo relays Pip, Pin, fluctuation of the common voltage occurs, and that fluctuation in the common voltage overlaps with the AC signal that is outputted from the AC-signal-output unit 71. Due to this overlap, there is a possibility that the determination of whether or not the high-voltage circuit is insulated will be incorrectly determined.

Therefore, in this embodiment, the point of time that the state of the relay switches 14, 15 and photo relays Pip, Pin changes is set so a not to be included in the period from the point of time that the AC-signal-output unit 71 outputs an AC signal until the point of time that the battery-control device 50 as a "detecting unit" detects the peak value of the AC signal. As a result, incorrect determination of electrical leakage is suppressed. Here, the relay switches 14, 15 and the photo relays Pip, Pin are switching elements that switch the connection between the battery pack 10 (and battery modules 11) and a specified voltage (ground voltage) to a conducting state or to a blocked state.

Figure 9:
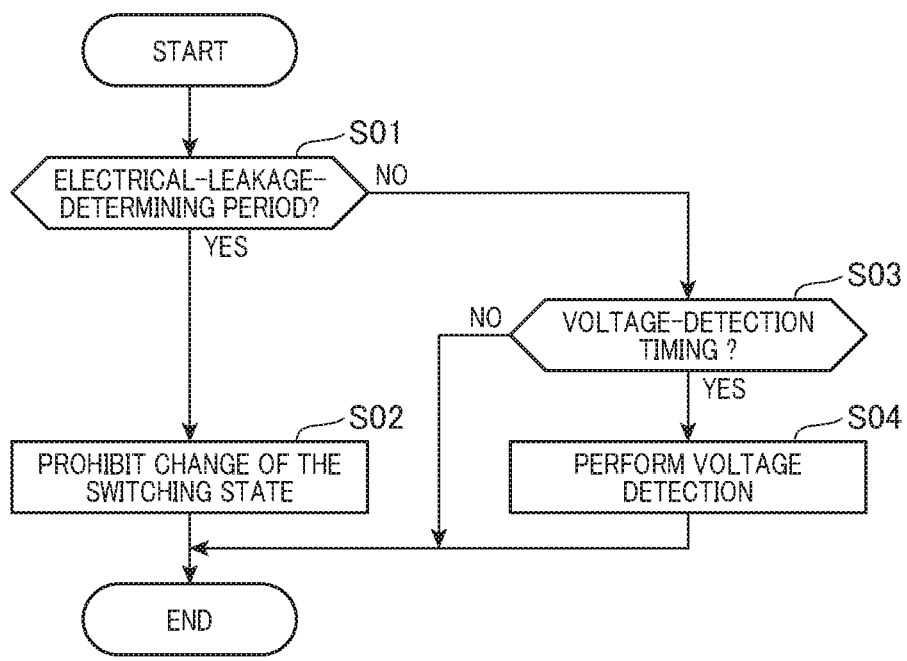
FIG. 9 is a flowchart illustrating a process for prohibiting change in the switching state of an embodiment.

FIG. 9 illustrates a flowchart illustrating a change-prohibiting process for prohibiting change in the switched state in this embodiment. This process is performed by the battery-control device 50 for every specified period.

In step S01, the battery-control device 50 determines whether or not the period is an electrical leakage-determining period. Here, the electrical leakage-determining period is a period that includes from the point of time that the AC-signal-output unit 71 starts outputting an AC signal until the battery-control device 50 detects the peak value of the AC signal. More specifically, the electrical leakage-determining period is the period from the point of time that the AC-signal-output unit 71 starts outputting an AC signal until the point of time that the AC-signal-output unit 71 stops outputting an AC signal.

When the period is an electrical leakage-determining period (S01: YES), in step S02, the battery-control device 50 prohibits change of the switched state. In other words, switching of the relay switches 14, 15 and detecting voltage by the voltage-detecting unit 80 is prohibited, and processing ends. Moreover, when the period is not an electrical leakage-determining period (S01: NO), in step S03, the battery-control device 50 determines whether or not the detecting period for detecting voltage has passed. When the detecting period has passed (S03: YES), in step S04, the battery-control device 50 sets the photo relays Pip, Pin to the ON state, performs voltage detection and ends the process. When the detecting period has not passed (S03: NO), the battery-control device 50 ends processing as is.

FIG. 10 illustrates an example of an electrical leakage-determining waveform when overlapping of the voltage-detection timing of the battery modules 11 (ON timing of the photo relays Pip, Pin), and output of an AC signal in electrical leakage determination is prohibited. In the example illustrated in FIG. 10, overlapping of the fluctuation in the common voltage that occurs as the state of the photo relays Pip, Pin changes and the AC signal that is used in electrical leakage determination is avoided.

(Other Embodiments)

In the embodiments described above, the configuration is such that the terminal voltage of a battery module 11 is detected at every specified detection period, however, instead of that configuration, configuration may be such that the terminal voltage of a battery module 11 is detected at arbitrary timing.

A battery pack 10 is used as a "battery", however instead of this configuration, a single battery may be used as the "battery".

In the embodiments above, configuration is such that both overlapping of the electrical leakage-determining period and the point of time of switching the state of the relay switches 14, 15, and overlapping of the electrical leakage-determining period and the point of time of switching the state of the photo relays Pip, Pin are prohibited. Modifying this, configuration may be such that only one of either overlapping of the electrical leakage-determining period and the point of time of switching the state of the relay switches 14, 15, or overlapping of the electrical leakage-determining period and the point of time of switching the state of the photo relays Pip, Pin is prohibited.

Configuration may be such that when the battery-control device 50 as a "detecting unit" detects the peak value of the AC signal, the AC-signal output unit ends output of the AC signal. With that configuration, it is possible to shorten the period that the AC signal is outputted for determining electrical leakage within a range that determining electrical leakage is possible. As a result, it is possible to lengthen the period in which it is possible to change the states of the relay switches 14, 15 and photo relays Pip, Pin as "switching elements".

Configuration is such that photo relays Pip, Pin are respectively connected to the positive electrode and negative electrode of a battery module 11, however, modifying this, configuration may be such that a photo relay is connected to only one of either the positive electrode or negative electrode. Moreover, configuration is such that relay switches 14, 15 are respectively connected to the positive electrode and negative electrode of a battery pack 10, however, modifying this, configuration may be such that a relay switch is connected to only one of either the positive electrode or negative electrode. Furthermore, instead of photo relays and relay switches, other switching elements such as MOS-FETs and the like may be used.

As long as the "specified circuit" has a "voltage source", the circuit is not limited to the circuit of the embodiments above.

What is claimed is:

1. A determining device that determines electrical leakage in a specified circuit having a voltage source, comprising:
   an AC signal-output unit that outputs an alternating current signal having a specified frequency to a signal line that is connected to the specified circuit;
   a detecting unit that detects a peak value of the AC signal on the signal line; and
   a determining unit that performs electrical leakage determination of the specified circuit based on the peak value; wherein
   the specified circuit includes first switching elements (Pip, Pin) and second switching elements (14, 15) that switch the connection between the voltage source and a specified voltage to a conducting state or a blocked state; and
   the determining device prohibits overlapping of the point of time when the switching elements are switched from the conducting state to the blocked state, and the point of time when switched from the blocked state to the conducting state, and the period from the point of time when the AC-signal-output unit starts outputting the AC signal until the detecting unit detects the peak value of the AC signal.

2. The determining device according to claim 1, wherein the specified circuit is connected to a differential-amplifier circuit to which both terminals of a battery as the voltage source are connected;
   the differential-amplifier circuit is connected with the specified circuit via a specified resistance; and
   the first switching elements are provided between at least one terminal of both terminals of the battery and the differential-amplifier circuit.

3. The determining device according to claim 2, wherein the first switching elements that are provided between at least one terminal of both terminals of the battery and the differential-amplifier circuit are switched from a blocked state to a conducting state at every specified period; and
   in a period from the point of time when the AC-signal-output unit starts outputting the AC signal until the detecting unit detects the peak value of the AC signal, the determining device prohibits switching the switching elements that are provided between at least one terminal of both terminals of the battery and the differential-amplifier circuit from a blocked state to a conducting state.

4. The determining device according to claim 1, wherein the specified circuit, includes an electric load that, together with being connected to the voltage source, is connected to the specified voltage; and the second switching elements are provided between the voltage source and the electric load.

5. The determining device according to claim 1 that prohibits overlapping of the point of time when the switching elements are changed from a conducting state to a blocked state, and the point of time when changed from a blocked state to a conducting state, and the period from the point of time when the AC-signal-output unit starts outputting the AC signal until AC-signal-output unit stops outputting the AC signal.

\* \* \* \* \*